US 9,148,183 B2

United States Patent
Alzaher

(10) Patent No.: US 9,148,183 B2
(45) Date of Patent: Sep. 29, 2015

(54) OPTIMAL LOW POWER COMPLEX FILTER

(71) Applicants:KING FAHD UNIVERSITY OF PETROLEUM AND MINERALS, Dhahran (SA); KING ABDULAZIZ CITY FOR SCIENCE AND TECHNOLOGY, Riyadh (SA)

(72) Inventor: Hussain Alzaher, Dhahran (SA)

(73) Assignees: KING FAHD UNIVERSITY OF PETROLEUM AND MINERALS, Dhahran (SA); KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 246 days.

(21) Appl. No.: 13/953,730

(22) Filed: Jul. 29, 2013

(65) Prior Publication Data

US 2015/0028944 A1 Jan. 29, 2015

(51) Int. Cl.
| | | |
|---|---|---|
| *G06G 7/02* | (2006.01) | |
| *H04B 1/10* | (2006.01) | |
| *H03H 11/04* | (2006.01) | |
| *H03H 11/12* | (2006.01) | |

(52) U.S. Cl.
CPC ................. *H04B 1/10* (2013.01); *H03H 11/11* (2013.01); *H03H 11/1217* (2013.01); *H03H 2011/0477* (2013.01); *H03H 2011/0494* (2013.01)

(58) Field of Classification Search
USPC ......................................................... 708/819
See application file for complete search history.

(56) References Cited

U.S. PATENT DOCUMENTS

| | | | |
|---|---|---|---|
| 5,124,666 A | 6/1992 | Liu et al. | |
| 6,212,540 B1 * | 4/2001 | Murakami et al. ............ | 708/819 |
| 6,266,689 B1 * | 7/2001 | Shier et al. ..................... | 708/819 |
| 6,976,051 B1 * | 12/2005 | Erdogan et al. ............... | 708/819 |
| 7,499,963 B2 * | 3/2009 | Harvey .......................... | 708/819 |
| 8,508,291 B1 * | 8/2013 | Alzaher ......................... | 327/553 |
| 2003/0146789 A1 | 8/2003 | Mitteregger | |
| 2004/0162023 A1 | 8/2004 | Cho | |
| 2005/0195013 A1 | 9/2005 | Yang et al. | |
| 2005/0233725 A1 | 10/2005 | Muhammad et al. | |
| 2007/0182480 A1 | 8/2007 | Kimura | |
| 2009/0147884 A1 | 6/2009 | Sridharan | |
| 2009/0191833 A1 | 7/2009 | Kaczman et al. | |
| 2010/0005430 A1 | 1/2010 | Chang et al. | |
| 2011/0140771 A1 | 6/2011 | Liao | |

OTHER PUBLICATIONS

Saad Mohammad Al-Shahrani and Muhammad Ali Al-Gahtani, "A New Polyphase Current-Mode Filter Using Digitally-Programmable CCCII", The 18$^{th}$ International Conference on Microelectronics 2006, pp. 142-145.

(Continued)

*Primary Examiner* — Tan V. Mai
(74) *Attorney, Agent, or Firm* — Richard C. Litman

(57) ABSTRACT

The optimal low power complex filter, as a second order complex filter, is based on current amplifiers (CAs) and is utilized to implement a 4th order current-mode filter that can be used for intermediate frequency (IF) applications, such as, for example, low-IF Bluetooth receivers. Fabricated in a standard 0.18 μm CMOS technology, experimental results show that the present design offers improved characteristics over the existing solutions in terms of power consumption and spurious-free dynamic range (SFDR). The 4$^{th}$ order filter exhibits in-band SFDR of 65.8 dB while consuming only 1 mW.

12 Claims, 13 Drawing Sheets

(56) References Cited

OTHER PUBLICATIONS

R. Alzaher, and N. Tasaddug, "A CMOS Low Power Current-Mode Polyphase Filter", 14th proceedings ACM/IEEE international symposium on low power electronics and design, pp. 75-80 (2009).

Alzaher, H.A.; Tasadduq, N.; Al-Ammari, F.S., "Optimal Low Power Complex Filters," Circuits and Systems I: Regular Papers, IEEE Transactions on , vol. 60, No. 4, pp. 885-895, Apr. 2013, and Abstract.

* cited by examiner

US 9,148,183 B2

OPTIMAL LOW POWER COMPLEX FILTER

BACKGROUND OF THE INVENTION

1. Field of the Invention

The present invention relates to analog filter circuits, and particularly to optimal low power complex filters.

2. Description of the Related Art

Active complex (polyphase) filters are renewed as they provide solutions for image rejection in low-IF wireless applications such as Bluetooth (BT) and Zigbee receivers. Also, they can be utilized in wireless sensor network and IEEE 802.15.4 applications such as $g_m$-C complex filters known in the prior art. These filters are often based on transconductance amplifier-C ($g_m$-C) or active-RC techniques. In addition, several polyphase filter realizations based on the second generation current conveyors (CCIIs), current feedback amplifiers (CFAs), current amplifiers (CAs) and current mirrors can, for example, be found in other prior arts. These filters can be classified based on their synthesis method into three categories: element substitution techniques of LC prototypes, cascading of first-order complex sections, and cascading of second-order complex biquads.

Complex filters based on LC simulation often use extensive number of active devices. For example, an exemplary prior art filter employs 30 transconductance amplifiers (TCAs) to realize $5^{th}$-order filter while 32, 48, 66 TCAs were respectively incorporated to achieve $3^{rd}$, $5^{th}$, $9^{th}$-order complex responses in other prior art implementations. In fact, it is found that the most efficient design among this category requires "3.7" TCAs per pole. On the other hand, first order filters may require only two devices. However, such filters would exhibit poor stopband attenuations since they are obtained from their first-order LPF counterparts. The available complex biquad filters incorporate 12 TCAs, 4 op-amps, 8 op-amps, 4 op-amps, and 10 CCIIs, depending on the chosen design. There remains the need for more efficient biquad complex filters.

Thus, an optimal low power complex filter solving the aforementioned problems is desired.

SUMMARY OF THE INVENTION

The optimal low power complex filter, as a second order complex filter, for example, is based on current amplifiers (CAs) and may be utilized to implement a 4th order current-mode filter that can be used for intermediate frequency (IF) applications, such as, for example, low-IF Bluetooth receivers. Fabricated in a standard 0.18 μm CMOS technology, experimental results show that the present design offers improved characteristics over the existing solutions in terms of power consumption and spurious-free dynamic range (SFDR). The $4^{th}$ order filter exhibits in-band SFDR of 65.8 dB while consuming only 1 mW.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

The optimal low power complex filter, as a second order complex filter, for example, is based on current amplifiers (CAs) and may be utilized to implement a 4th order current-mode filter that can be used for intermediate frequency (IF) applications, such as, for example, low-IF Bluetooth receivers. Fabricated in a standard 0.18 μm CMOS technology, experimental results show that the present design offers improved characteristics over the existing solutions in terms of power consumption and spurious-free dynamic range (SFDR). The $4^{th}$ order filter exhibits in-band SFDR of 65.8 dB while consuming only 1 mW.

Optimization criteria are defined as follows. The power consumption of filters based on a given amplifier type is directly proportional to the number of active elements employed. Whereas, the power consumption of filters based on various amplifier types depends on individual power of various amplifiers as well as their numbers. However, given that the different kinds of amplifiers can be decomposed to common basic cells, then the power consumption will be directly proportional to the number of cells.

Figure 1A:
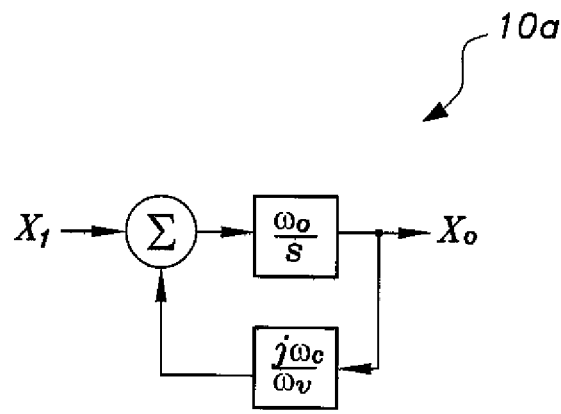
FIG. 1A is a block diagram of the basic frequency shifting apparatus according to the present invention.
Figure 1B:
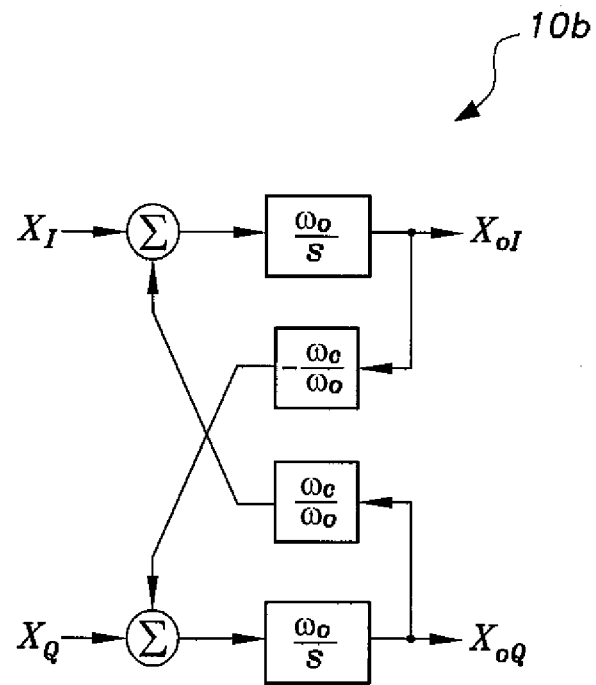
FIG. 1B is a block diagram of the complex integrator according to the present invention.

In embodiments of the optimal low power complex filer complex lossless integrators are utilized to develop complex filters based on two-integrator loop topologies. An arbitrary normal integrator with time constant $\tau=1/\omega_o$ can be converted to a complex integrator when every frequency dependent element in the original integrator is modified to be a function of $s-j\omega_c$ instead of s, (s being a Laplace transform parameter representing the complex frequency $\sigma+j\omega$) as shown in circuit 10a of FIG. 1A. In practice, the complex frequency multiplication is realized by cross coupling between the In-phase (I) and Quadrature (Q) paths of the integrator as shown in circuit 10b of FIG. 1B leading to the following transfer characteristics:

$$\frac{X_{oI}}{X_I} = \frac{X_{oQ}}{X_Q} = \frac{\omega_0}{(s - j\omega_c)}, \quad (1)$$

where input and output variables can be voltage or current signals.

Figure 2:
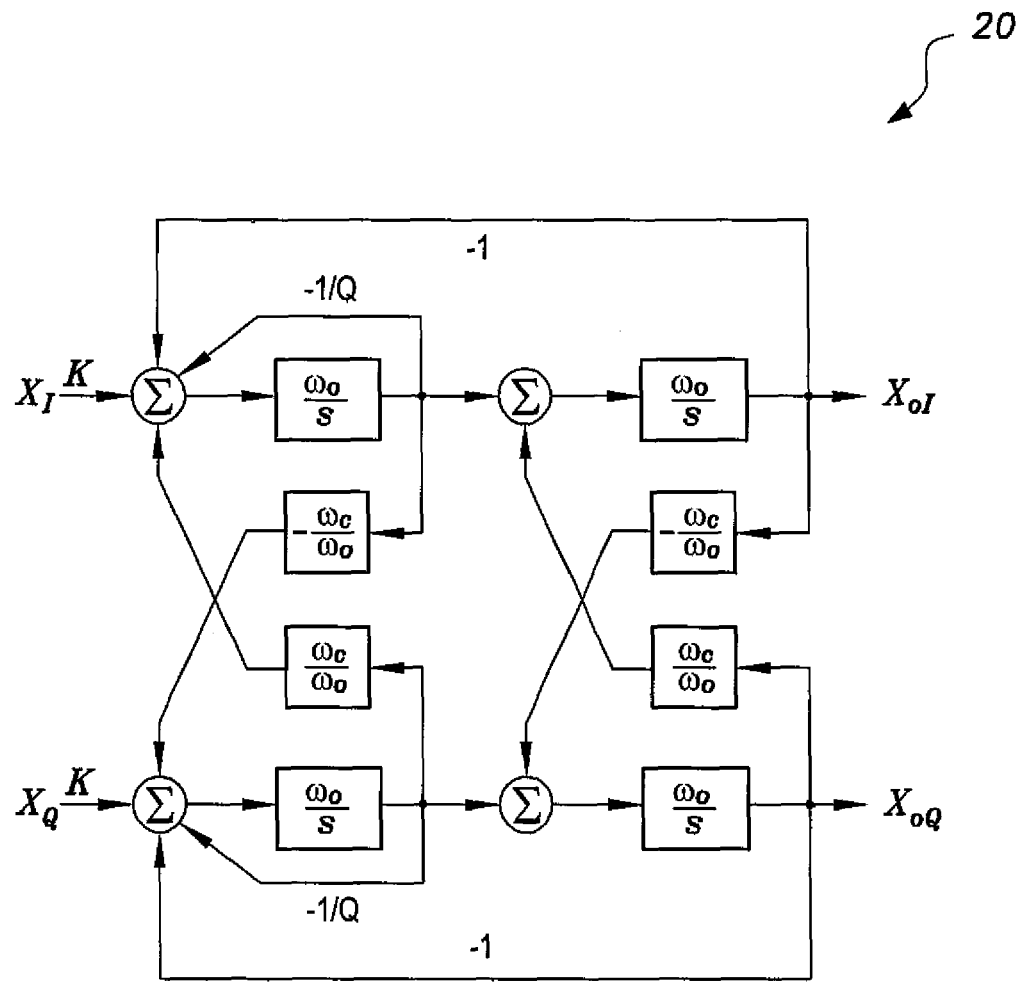
FIG. 2 is a block diagram of the two integrator loop complex filter according to the present invention.

Two complex integrators can be used in cascade to develop a two integrator loop complex filter circuit 20, as shown in FIG. 2. The corresponding transfer functions (TFs) are given by, $$H_c(s)\frac{X_{oI}}{X_I} = \frac{X_{oQ}}{X_Q} = \frac{K\omega_0^2}{(s - j\omega_c)^2 + (s - j\omega_c)(\omega_0/Q) + \omega_0^2}. \quad (2)$$

The complex bandpass filter given by (2) exhibits a center frequency of $\omega_c$, pole frequency of $\omega_o$, pole quality factor of Q and bandwidth of $2\omega_o/Q$ (i.e. twice the bandwidth of the original lowpass filter). The non-inverting integrators in FIG. 2 can be replaced by inverting ones; however, proper negative feedbacks should be maintained.

It is essential for integrated continuous time filters to be associated with tunable parameters in order to achieve accurate frequency characteristics and compensate for process variations and temperature effects. The parameter $\omega_c$ and $\omega_o$ are functions of RC products which cannot be implemented accurately in ICs. On the other hand, Q is usually a function of resistor and/or capacitor ratios that can be implemented precisely. Therefore, it is desired to design the filters with independent control of $\omega_c$ and/or $\omega_o$ without changing Q. The tuning requirement of a complex filter depends on the nature of RC terms involved in $\omega_c$ and $\omega_o$. For the case when $\omega_c$ and $\omega_o$ have same RC product terms, it is sufficient to have common tuning scheme. However, when they have different RC products separate tuning circuits would be needed. Hence, the former case requires simpler automatic tuning schemes. The image rejection ratio (IRR) of a complex filter obtained from FIG. 2 can be expressed as:

$$\text{IRR} = \sqrt{(1 + 4(\omega_c/\omega_0)^2)^2 + (4/Q^2)(\omega_c/\omega_0)^2}. \quad (3)$$

Clearly, selecting higher center frequency for BT improves the IRR. On the other hand, it can be shown that the ideal image rejection ratio (IRR) of any complex filter obtained from first-order LPF is given by:

$$\text{IRR} = \sqrt{(1 + 4(\omega_c/\omega_0)^2}. \quad (4)$$

This means that the complex filters obtained from their biquad counterparts inherently exhibit better IRR than two cascaded stages of first-order. As an example, the pole frequency $f_o$ may be set to 1.43 MHz for each section such that the overall bandwidth of a six stage design becomes 1 MHz. This leads to a nominal IRR per stage of 12.7 dB. Whereas, the IRR of a second-order Butterworth biquad ($f_o$=0.5 MHz) is 43.3 dB.

TCA filters are realized by CCIIs allowing comparison with TRA and CA at device level. A TCA obtained from a CCII is also attractive because it provides better linearity than conventional TCA circuits particularly for low supply voltages. Basically, CCII is a VB whose output is sensed and conveyed to current output terminal Z. The terminal characteristics of the CCII can be described by $I_Y=0$, $V_X=V_Y$, $I_Z=I_X$ or $I_Z=kI_X$ when current gain is required. VM cascadable integrators can be realized using TCAs, op-amps or TRAs. In the case of adopting single output TCAs (CCII whose X terminal are loaded with passive resistors), an additional TCA per path would be required to realize the complex feedback loop. Therefore, 12 TCAs (or CCIIs) would be used: 8 TCAs to form the two complex integrators while 4 TCAs to implement the original negative feedbacks. The total number of devices can be reduced to 10 CCIIs (or TCAs) when two transconductors are replaced by two passive resistors. Adopting multi-output CCIIs further reduces active devices to 8, as shown in circuit 30 of FIG. 3. It can be shown that the transformation function (TF) of the filter is given by:

$$H_P(s) = \frac{1/C^2 R_1 R_2}{(s-j\omega_c)^2 + (s-j\omega_c)K_q/(CR_3) + 1/C^2 R_2 R_3}. \quad (5)$$

Hence, the filter exhibits $\omega_c=K_c/CR_3$, $\omega_o=1/C\sqrt{R_2R_3}$, $Q_o=R_3/K_q\sqrt{R_2R_3}$ and $K=R_3/R_1$. It is possible to change this filter to active-C topology, such as by replacing CCII by CCCII, for example. In this case, the passive resistors would be replaced by the internal resistance of the X terminals of the CCCII. Although active-C topologies may save silicon area they would degrade the linearity performance.

Figure 4:
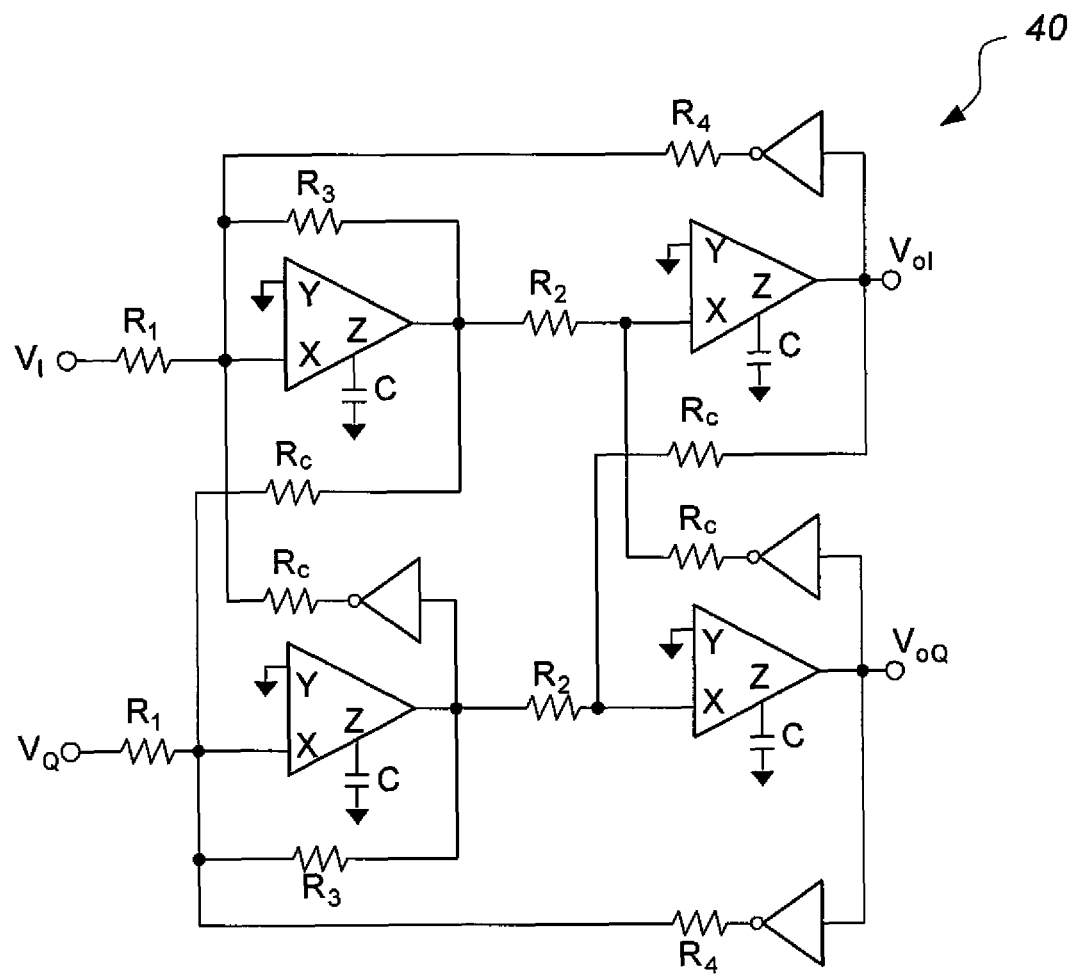
FIG. 4 is a block diagram of a TRA based VM complex filter realized with CFAs (CCII+VB) according to the present invention.

In fact, a complex VM integrator can be realized with a single device only if it has both low output impedance and input virtual ground to facilitate the addition of the feedback signals. These two features are inherently available in the op-amp and the TRA. But op-amp based filters consume relatively high power at IF ranges. Alternatively, a complex filter circuit 40 based on TRAs is developed as shown in FIG. 4. A TRA can be realized with a CCII whose Y-terminal is grounded plus a VB connected between Z and the output voltage terminal. Such configuration is often represented by CFAs (CCII plus VB), known to exhibit independent gain bandwidth characteristics. It can be shown that its TF of the filter is given by:

$$H_P(s) = \frac{1/C^2 R_1 R_2}{(s-j\omega_c)^2 + (s-j\omega_c)/(CR_3) + 1/C^2 R_2 R_4}. \quad (6)$$

Thus, the filter exhibits $\omega_c=1CR_c$, $\omega_o=1/C\sqrt{R_2R_4}$, $Q_o=R_3/\sqrt{R_2R_4}$ and $K=R_4/R_1$.

Figure 5:
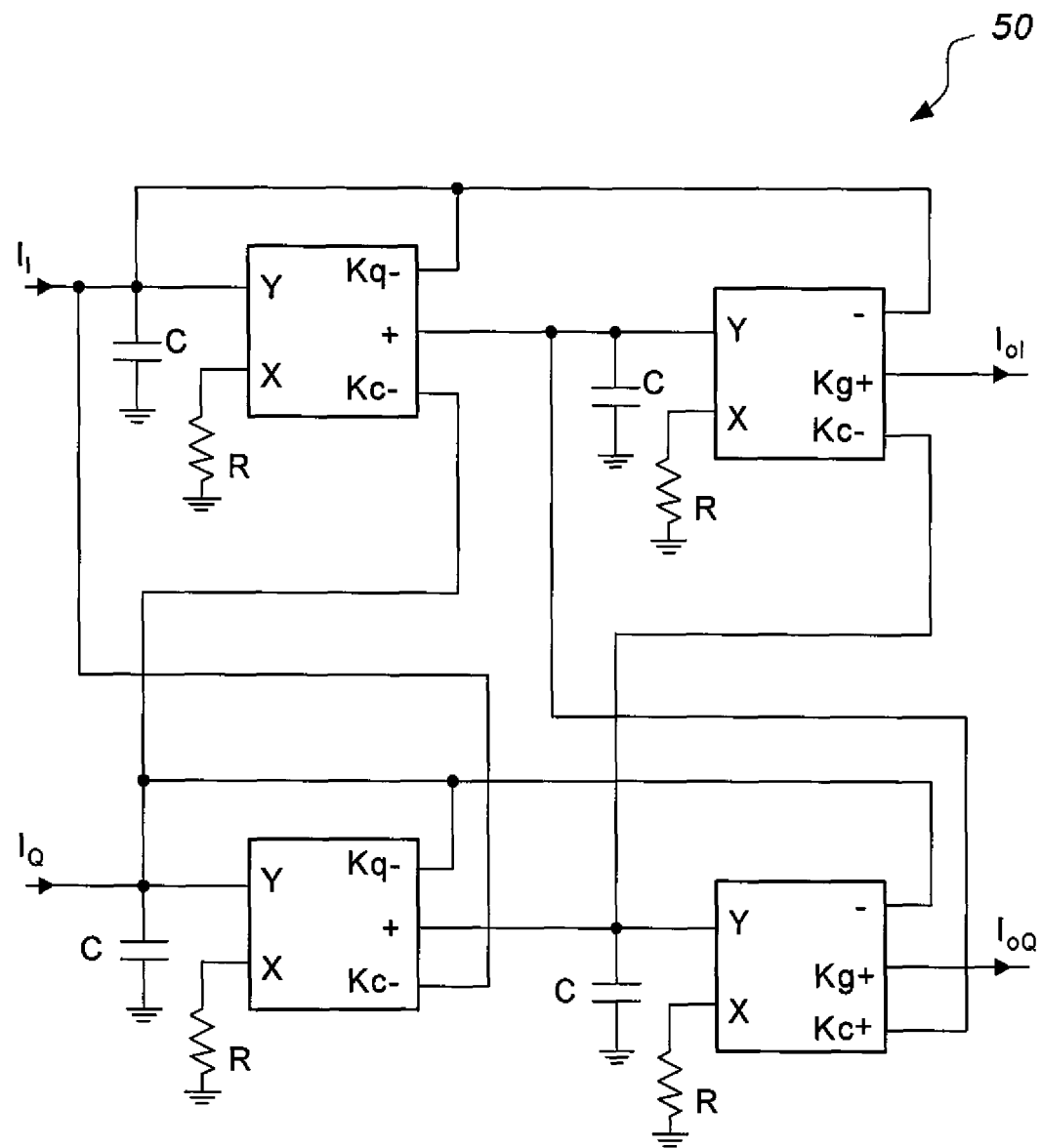
FIG. 5 is a block diagram of a CM complex filter based on TCA realized with CCIIs according to the present invention.

On the other hand, it is more efficient to realize CM cascadable complex integrators with high output impedances rather than with low input impedances. This is because the latter case would require additional devices in order to realize the complex feedback loops. It can be observed that TCA and CA can efficiently develop the CM complex integrator of FIG. 1. The CM complex filter circuit 50 based on the TCA (CCII) is shown in FIG. 5. It is based on four CCIIs (TCAs) each having three current outputs. It can be shown that the TF of the filter is given by:

$$H_P(s) = \frac{K_g/(C^2 R^2)}{(s-j\omega_c)^2 + (s-j\omega_c)K_q/(CR) + 1/(C^2 R^2)}. \quad (7)$$

Hence, the filter exhibits $\omega_c=K_c/CR$, $\omega_o=1/CR$, $Q_o=1/K_q$ and $K=K_g$.

Figure 6:
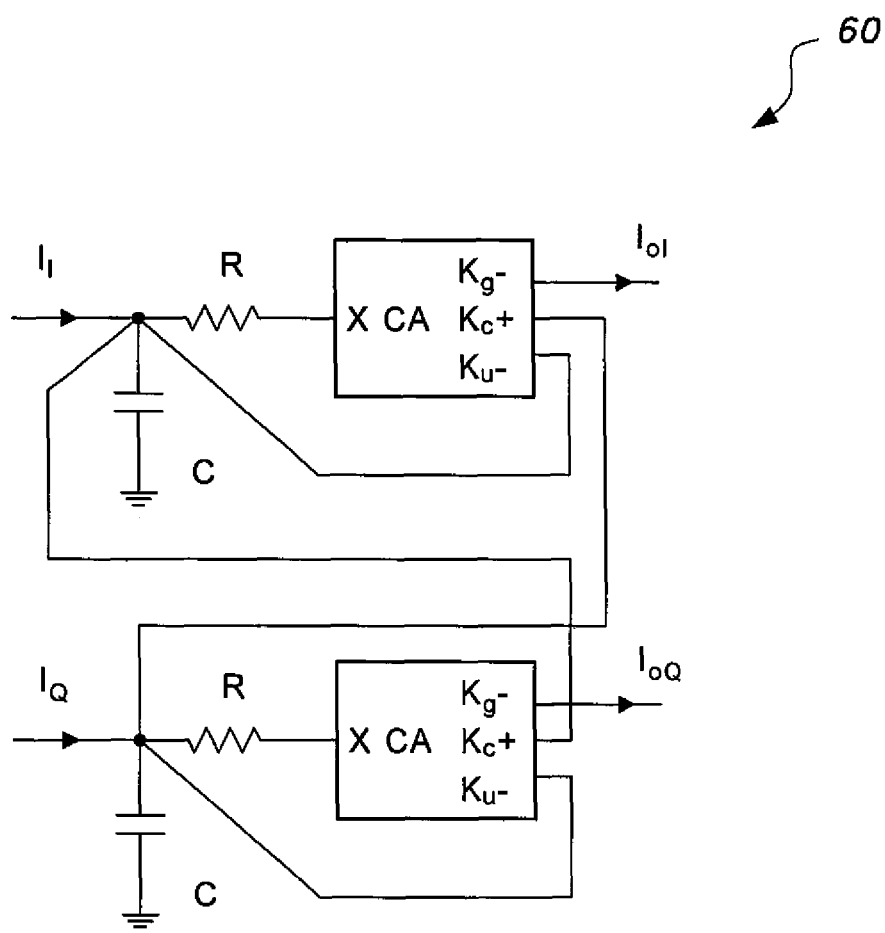
FIG. 6 is a block diagram of a CM complex integrator based on CAs according to the present invention.
Figure 7:
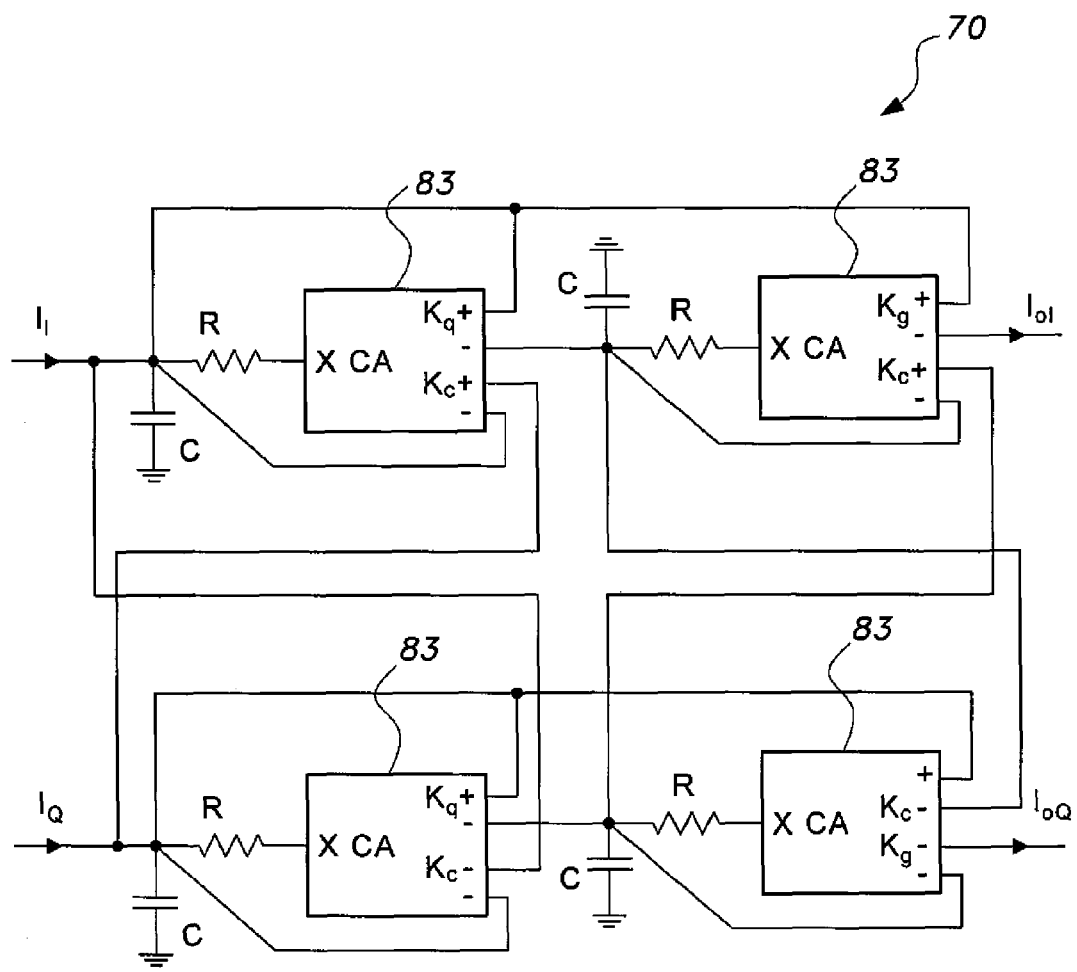
FIG. 7 is a block diagram of a CM complex filter based on CAs according to the present invention.

Unlike the cascadable CM integrator based on CCII, developing its counterpart based on CA is more involved. Basically, there are two alternatives. The first option is through applying the input current at the X-terminal and connecting a shunt integrating capacitor at the output terminal Z to perform integration. Then, the voltage of the capacitor is converted again to an output current using voltage to current converter. A more efficient realization is obtained via converting the lossy CM passive integrator to a lossless cascadable topology with the help of dual output CA. Utilizing a third output current terminal, the desired complex integrator circuit 60 is developed as shown in FIG. 6. The input virtual ground is utilized to sense the current in the resistor whereas the three outputs with gains $K_u=1$, $K_c$, $K_g$ are utilized for converting the integrators from lossy to lossless, realizing the complex loops and cascading, respectively. The corresponding complex filter 70 including a plurality of CAs 83 is developed as shown in FIG. 7. It can be shown that its TF is given by:

$$H_p(s) = \frac{K_g/(C^2R^2)}{(s-j\omega_c)^2 + (s-j\omega_c)K_q/(CR) + 1/(C^2R^2)}. \quad (8)$$

Thus, the filter exhibits $\omega_c = K_c/CR$, $\omega_o = 1/CR$, $Q_o = 1/K_q$, and $K = K_g$, where $\omega_c$ is a center frequency, $\omega_o$ is a pole frequency, $Q_o$ is a pole quality factor, $H_p$ (s) is a transfer function of the complex filter, $K_g$, $K_q$, and $K_c$ are gains of the complex filter, C is a capacitance in the complex filter, R is a resistance in the complex filter, and s is a Laplace transform parameter representing the complex frequency $j\omega$.

The current consumption of a single output CCII can be expressed as the biasing current of the VB plus the standby current ($I_{SB}$) of the output current terminal Z and hence each of other Z terminals would require additional $I_{SB}$. Typically, the buffer current is around 5 to 10 times the value of $I_{SB}$. The current consumption of a CFA (CCII plus VB) would be $2I_{CCII}$-$I_{SB}$. Therefore, the total currents of the filters of FIG. 3, FIG. 4, FIG. 5 and FIG. 7 are given by $8I_{CCII}$+$4I_{SB}$, $8I_{CCII}$-$4I_{SB}$, $4I_{CCII}$+$8I_{SB}$, and $4I_{CCII}$+$12I_{SB}$. These results are calculated assuming positive and negative outputs CCII consume same power since fully differential designs require no inverters. It can be seen that the CM filters of FIG. 5 and FIG. 7 are significantly more power efficient than the VM filters.

In addition, it can be seen from equations (5) to (8) that the $\omega_o$ of all five filters can be tuned independently without disturbing $Q_o$ and gain. But the CM filters of FIG. 5 and FIG. 7 have additional advantage of including same RC product terms for $\omega_c$ and $\omega_o$ and hence will require a single tuning circuit.

Figure 3:
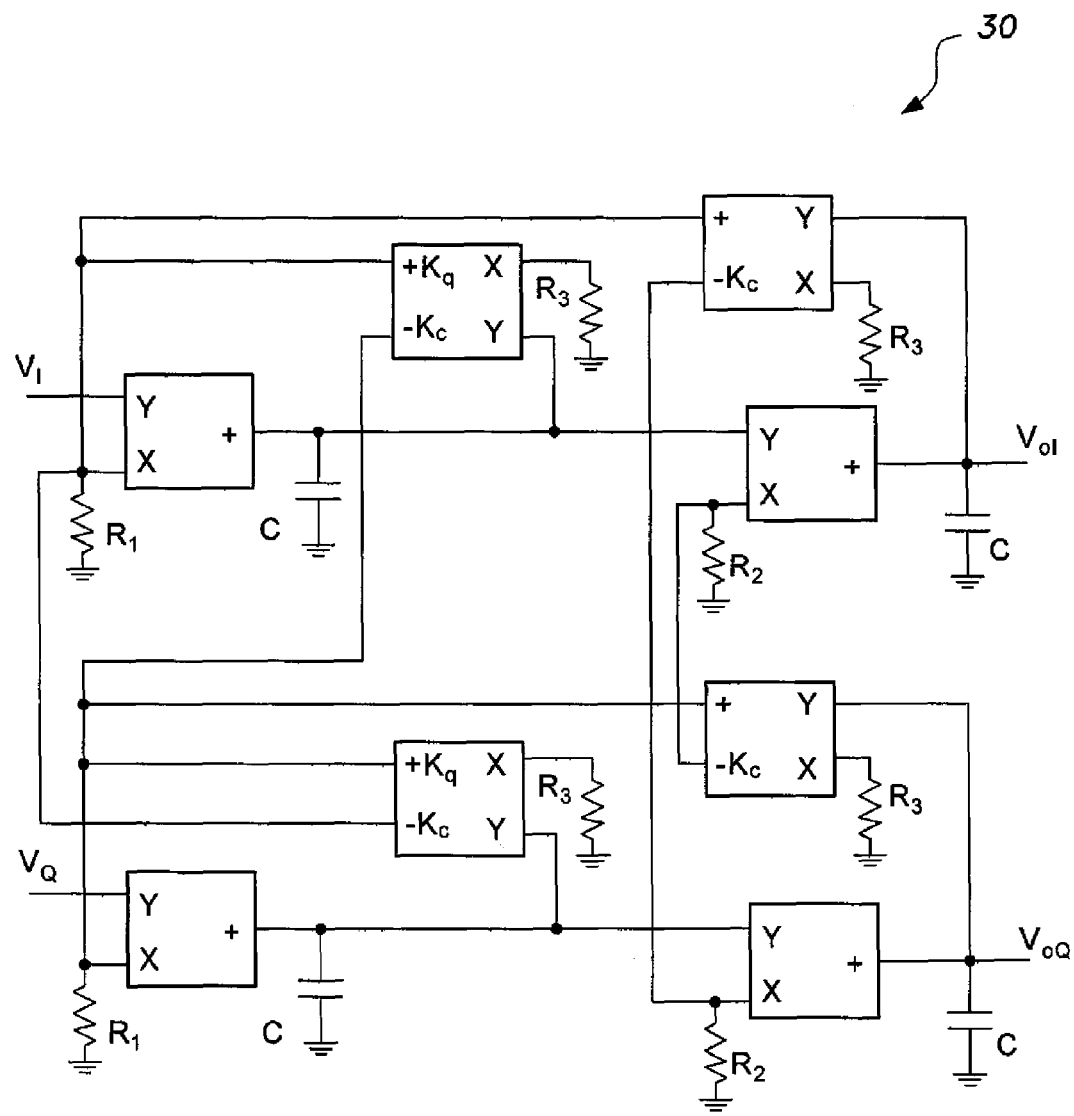
FIG. 3 is a block diagram of a TCA based VM complex filter realized with CCIIs according to the present invention.

Considering non-ideal high frequency operation, it can be seen that there are two parasitic poles associated with the filter of FIG. 3 at $1/(R_1||r_x)(3C_Z)$ and $1/(R_2||r_x)(C_Z)$. In contrast, the filters of FIG. 4, FIG. 5 and FIG. 7 have no parasitic poles. This is because the capacitors $C_Z$ for all, CFA, CCIIs or CAs are in parallel with the passive capacitances. The main characteristics and results related to various filter topologies are highlighted in Table I. Clearly, this table shows that filters of FIG. 5 and FIG. 7 utilizing CM signal processing offer advantageous features over their VM counterparts in terms of power consumption, simpler tuning, and more compatibility for high frequency operation.

TABLE 1

Compatibility of various amplifiers with complex filters.

| Mode | Features | VA | TCA | TRA | CA |
|---|---|---|---|---|---|
| Voltage | Devices | 4 | 8 | 4 | Not suitable |
| | CCIIs | 12 | 8 | 8 | |
| | Tuning circuits | 2 | 2 | 2 | |
| | Frequency limitations | Gain bandwidth product | Parasitic poles | No parasitic poles | |
| Current | Devices | Not suitable | 4 | Not suitable | 4 |
| | CCIIs | | 4 | | 4 |
| | Tuning circuits | | 1 | | 1 |
| | Frequency limitations | | No parasitic poles | | No parasitic poles |

Figure 8A:
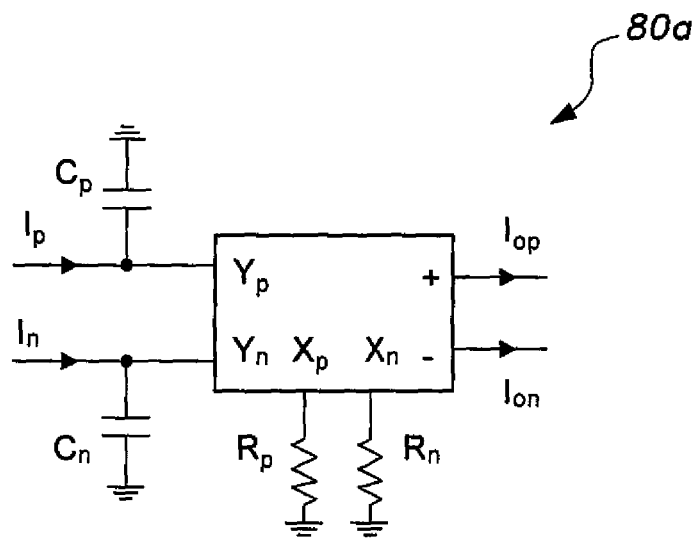
FIG. 8A is a block diagram of a differential integrator based on CCII according to the present invention.

Fully differential realization is another major issue related to the power consumption. Fully differential architectures enhance the performance in terms of supply noise rejection, dynamic range, and harmonic distortion. A fully differential CCII can be used to develop a differential current integrator circuit 80a as shown in FIG. 8A. The power consumption of the fully differential CCII is typically twice that of a single ended CCII. For matched passive components, the output current of circuit 80a of FIG. 8A would be $I_{op}-I_{on}=(I_p-I_n)/(sCR)$, having zero common-mode output. But considering voltage tracking errors between Y-X terminals denoted by $\beta=1-\epsilon$ with $|\epsilon|\ll 1$, current tracking error between Z-X terminals ($\alpha=1-\epsilon$), and mismatch of the passive components, the differential output current becomes:

$$I_{op} - I_{on} = \frac{\alpha_p \beta_p}{sC_p R_p} I_p - \frac{\alpha_n \beta_n}{sC_n R_n} I_n. \quad (9)$$

This relation is rearranged to obtain the differential and common-mode components as shown in (10) below. Mismatches are designated by $\Delta\beta=\beta_p-\beta_n$, $\Delta\alpha=\alpha_p-\alpha_n$, $\Delta C=C_p-C_n$, and $\Delta R=R_p-R_n$ where $\beta$, $\alpha$, R and C are the averages of the two ideally matched components. These relations can be used with (10) to obtain (11) as shown below.

$$I_{op} - I_{on} = \frac{1}{2}\left(\frac{\alpha_p \beta_p}{sC_p R_p} + \frac{\alpha_n \beta_n}{sC_n R_n}\right)(I_p - I_n) + \left(\frac{\alpha_p \beta_p}{sC_p R_p} - \frac{\alpha_n \beta_n}{sC_n R_n}\right)\left(\frac{I_p + I_n}{2}\right), \quad (10)$$

and $$I_{op} - I_{on} = \frac{\alpha\beta}{sCR}\left[\frac{\left(1+\frac{\Delta\alpha}{2\alpha}\right)\left(1+\frac{\Delta\beta}{2\beta}\right)}{\left(1+\frac{\Delta C}{2C}\right)\left(1+\frac{\Delta R}{2R}\right)} + \frac{\left(1-\frac{\Delta\alpha}{2\alpha}\right)\left(1-\frac{\Delta\beta}{2\beta}\right)}{\left(1-\frac{\Delta C}{2C}\right)\left(1-\frac{\Delta R}{2R}\right)}\right](I_p - I_n) + \frac{\alpha\beta}{sCR}\left[\frac{\left(1+\frac{\Delta\alpha}{2\alpha}\right)\left(1+\frac{\Delta\beta}{2\beta}\right)}{\left(1+\frac{\Delta C}{2C}\right)\left(1+\frac{\Delta R}{2R}\right)} - \frac{\left(1-\frac{\Delta\alpha}{2\alpha}\right)\left(1-\frac{\Delta\beta}{2\beta}\right)}{\left(1-\frac{\Delta C}{2C}\right)\left(1-\frac{\Delta R}{2R}\right)}\right]\left(\frac{I_p + I_n}{2}\right). \quad (11)$$

By neglecting second-order terms, (11) reduces to (12) shown below.

$$I_{op} - I_{on} \approx \frac{\alpha\beta}{sCR}(I_p - I_n) + \frac{\alpha\beta}{sCR}\left[\frac{\Delta\alpha}{\alpha} + \frac{\Delta\beta}{\beta} + \frac{\Delta C}{C} + \frac{\Delta R}{R}\right]\left(\frac{I_p + I_n}{2}\right). \quad (12)$$

Since the mismatch factors can be positive or negative, the signs of the individual terms are of no particular importance. When the terms have signs such that the individual contributions add, they produce the worst-case common-mode rejection ratio (CMRR) of:

$$CMRR_1 = \left(\left|\frac{\Delta\alpha}{\alpha}\right| + \left|\frac{\Delta\beta}{\beta}\right| + \left|\frac{\Delta C}{C}\right| + \left|\frac{\Delta R}{R}\right|\right)^{-1}. \quad (13)$$

Figure 8B:
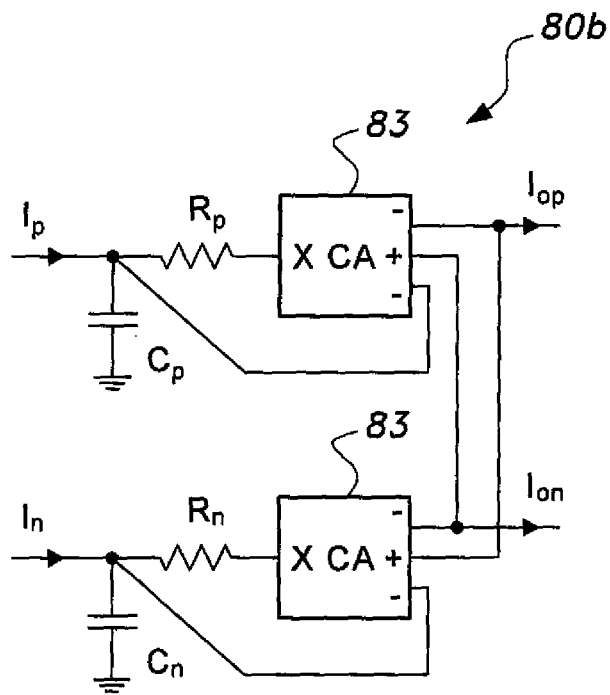
FIG. 8B is a block diagram of a differential integrator based on CA according to the present invention.

On the other hand, a differential CA-based integrator circuit 80b is shown in FIG. 8B. It employs CAs having both positive ($Z_p$) and negative ($Z_n$) outputs to perform subtraction at the output terminals.

The current consumption of this topology would be $2CCII+4I_{SB}$. Assuming perfect current transfer, the output is pure differential given by $I_{op}-I_{on}=2(I_p-I_n)/(sCR)$. In presence of mismatches, the TF of the integrator circuit 80b of FIG. 8B would be expressed as:

$$I_{op} - I_{on} = \left(\frac{\alpha_{n1} + \alpha_{p1}}{sC_pR_p + 1 - \alpha_{up}}\right)I_p - \left(\frac{\alpha_{n2} + \alpha_{p2}}{sC_nR_n + 1 - \alpha_{un}}\right)I_n. \quad (14)$$

This relation can be rearranged to obtain the differential and common-mode components as shown in (15) shown below where $\epsilon_p=1-\alpha_{up}$ and $\epsilon_n=1-\alpha_{un}$. Considering various statistical mismatches including $\epsilon_p=\epsilon+\Delta\epsilon/2$ and $\epsilon_n=\epsilon-\Delta\epsilon/2$, (15) reduces to (16) shown below when neglecting second-order terms. Therefore, the $CMRR_2$ of the integrator 80b of FIG. 8B will be given by (17) shown below.

$$I_{op} - I_{on} = \frac{1}{2}\left(\frac{\alpha_{n1} + \alpha_{p1}}{sC_pR_p + \epsilon_p} + \frac{\alpha_{n2} + \alpha_{p2}}{sC_nR_n + \epsilon_n}\right)(I_p - I_n) + \quad (15)$$
$$\left(\frac{\alpha_{n1} + \alpha_{p1}}{sC_pR_p + \epsilon_p} - \frac{\alpha_{n2} + \alpha_{p2}}{sC_nR_n + \epsilon_n}\right)\left(\frac{I_p + I_n}{2}\right),$$

$$I_{op} - I_{on} = \frac{1}{sCR}\left(\frac{\alpha_n + \alpha_p(1+\epsilon)}{1 + \frac{2\epsilon}{CR} - \frac{2\Delta\epsilon}{2C^2R^2} + \frac{\epsilon^2}{C^2R^2}}\right)(I_p - I_n) + \quad (16)$$
$$\frac{1}{sCR}\left[\frac{(\Delta\alpha_n + \Delta\alpha_p)\left(1 + \frac{\epsilon}{CR}\right) - (\alpha_n + \alpha_p)\left(\frac{\Delta C}{C} + \frac{\Delta R}{R}\right)}{1 + \frac{2\epsilon}{CR} - \frac{2\Delta\epsilon}{2C^2R^2} + \frac{\epsilon^2}{C^2R^2}}\right]\left(\frac{I_p + I_n}{2}\right),$$

and $$CMRR_2 = \frac{(\alpha_n + \alpha_p)(1+\epsilon)}{(\Delta\alpha_n + \Delta\alpha_p)(1+\epsilon/CR) - (\alpha_n + \alpha_p)(\Delta C/C + \Delta R/R)}. \quad (17)$$

Assuming $\alpha_n=\alpha_p=\alpha$ and neglecting $\epsilon$, $CMRR_2$ becomes:

$$CMRR_2 = \left(\frac{\Delta\alpha}{\alpha} - \frac{\Delta C}{C} - \frac{\Delta R}{R}\right)^{-1}. \quad (18)$$

Clearly, there is one less mismatch contribution (beta-mismatch is absent) in (18) compared to (13). Thus, the circuit 80b of FIG. 8B would offer better CMRR than that of circuit 80a shown in FIG. 8A while consuming comparable power.

With respect to the two main parameters related to the dynamic range of the two filters of FIG. 5 and FIG. 7, first, signal limitations due to restricted proper operation of the active devices and power supply voltages are investigated. The voltage swing in CCII based filters are limited by the VB used to implement the Y-X characteristic denoted by ($|V_{VB}|$) whereas current signals are restricted by linear region of the CF forming the Z-X characteristic designated by ($|I_{CF}|$). For the two CCIIs on the left of FIG. 5, these restrictions can be mathematically expressed as (19) shown below in which D(s) is the denominator polynomial of the TF of (7).

$$\max\{V_{y1}, V_{x1}\} = \left|\frac{(s-j\omega_c)/C}{D(s)}I_i\right| < |V_{VB}| \quad (19)$$

$$\max\{I_x, I_z\} =$$
$$\max\left\{\left|\frac{(s-j\omega_c)/RC}{D(s)}I_i\right|, \left|\frac{K_q(s-j\omega_c)/RC}{D(s)}I_i\right|\right\} < |I_{CF}|$$

When $K_q$ is greater than or equal one, this relation can be rewritten as:

$$|I_i| < \min\left\{\left|\frac{D(s)}{(s-j\omega_c)/C}V_{VB}\right|, \left|\frac{D(s)}{K_q(s-j\omega_c)/RC}I_{CF}\right|\right\}. \quad (20)$$

Similarly, for the two CCIIs on the right of FIG. 5, these restrictions can be mathematically expressed as:

$$|I_i| < \min\left\{\left|\frac{D(s)}{1/C^2R}V_{VB}\right|, \left|\frac{D(s)}{1/C^2R^2}I_{CF}\right|\right\}. \quad (21)$$

On the other hand, the signal limitations of the filter of FIG. 7 are due to the node voltage ($|V_R|$) and CA current ($|I_{CA}|$). Assuming the CA is implemented using CCII, results in $|I_{CA}|=|I_{CF}|$ and yields the following condition for the two CAs 83 on the left of FIG. 7:

$$|I_i| < \min\left\{\left|\frac{D(s)}{(s-j\omega_c)/C}V_{Supply}\right|, \left|\frac{D(s)}{K_q(s-j\omega_c)/RC}I_{CF}\right|\right\}. \quad (22)$$

Similarly, for the two CAs 83 on the right of FIG. 7, these restrictions can be mathematically expressed as:

$$|I_i| < \min\left\{\left|\frac{D(s)}{1/C^2R}V_{Supply}\right|, \left|\frac{D(s)}{1/C^2R^2}I_{CF}\right|\right\}. \quad (23)$$

By careful inspection of (20) through (23), the following significant conclusions are deduced. For the cases where $R<K_q|V_{VB}/I_{CF}|$, the two filters exhibit same signal swing. Assuming typical values of $|V_{VB}|=1$ V obtained from a supply voltage of 1.8 V, $|I_{CF}|=1$ mA and $K_q=1.42$ (Butterworth response), indicates that R must be selected to be less than 1.42 kΩ in order for the filter of FIG. 5 to have same signal swing as its counterpart of FIG. 7. Similarly, it can be shown that when $K_q$ is less than unity, the two filters will have same signal swing for $R<|V_{VB}/I_{CF}|=1$ kΩ. This small resistance would require relatively large capacitances that might not be practically suitable for IC implementation. For example, a filter with a pole frequency of 500 kHz would require capacitors of approximately 320 pF when R=1 kΩ. In conclusion, the CA-based filter would exhibit $(1+|V_{Supply}-V_{VB}|)$ times the maximum input current of CCII-based filter which is typically 80% more signal swing. The linear range of a VB can be extended using more complex structures but they would usually be associated with more power consumption, less linearity, and/or more inherent noise.

Figure 9A:
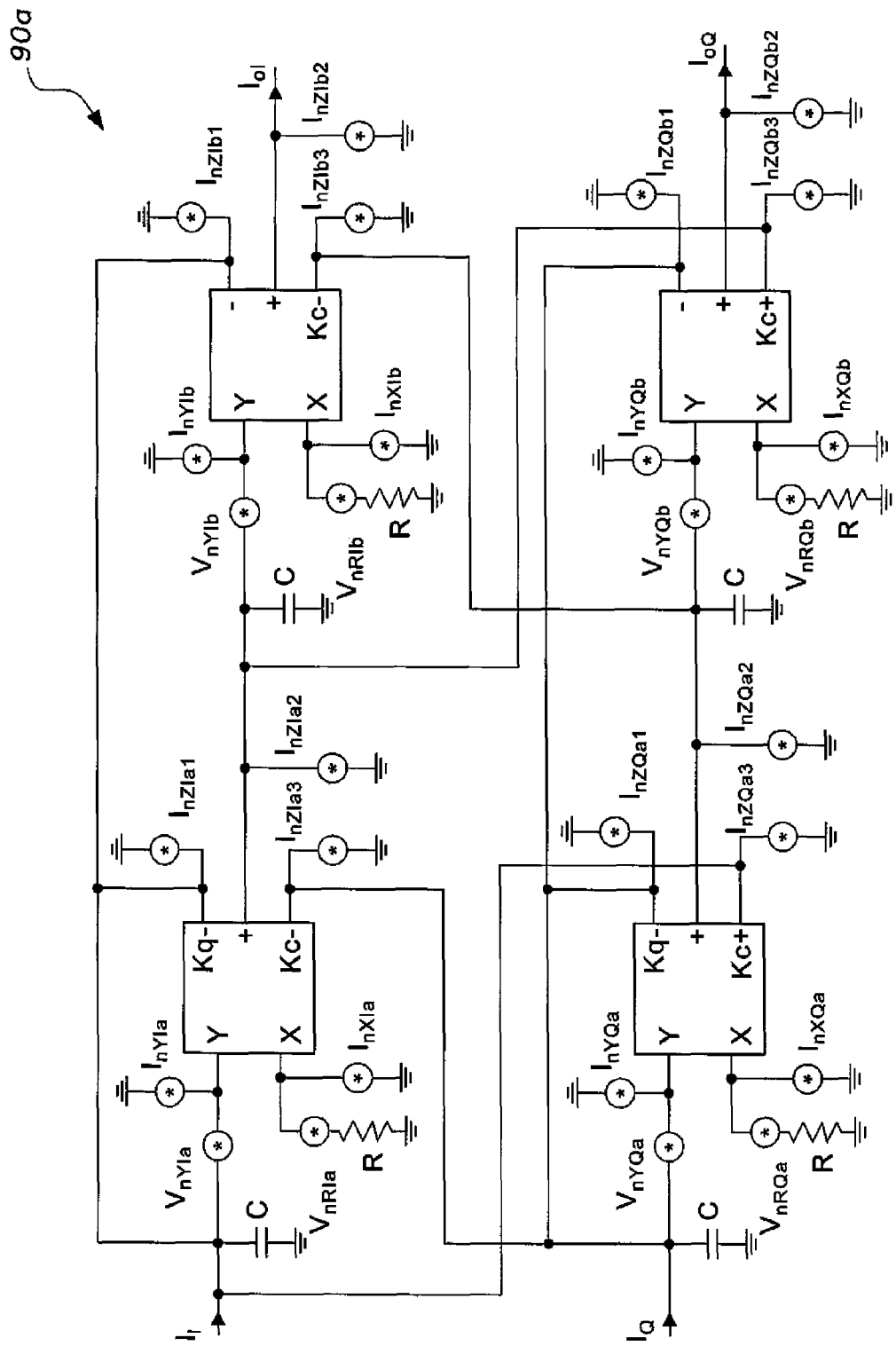
FIG. 9A is a block diagram of a filter based on CCIIs according to the present invention.
Figure 9B:
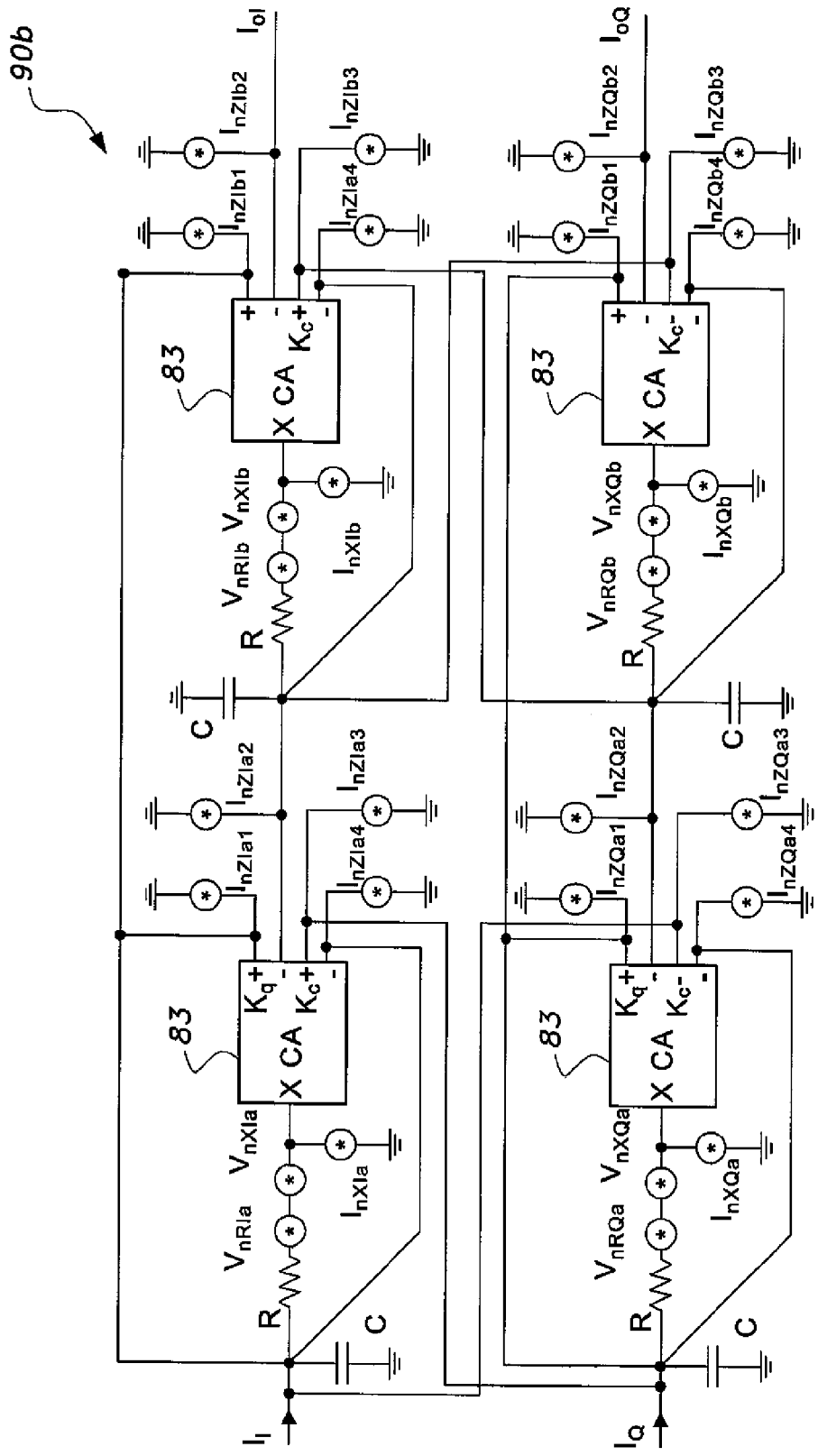
FIG. 9B is a block diagram of a filter based on CAs according to the present invention.

The second parameter that decides on the dynamic range of a filter is noise. The internal thermal noise of a CCII can be modeled as voltage and current sources at the Y-terminal denoted by $V_{nY}$ and $I_{nY}$ as well as current sources of $I_{nX}$ at the X terminal and $L_{nZi}$ at every $Z_i$ terminal. Whereas, the internal thermal noise of a CA can be characterized with voltage and current sources at the input-terminal denoted by $V_{nX}$, and $I_{nX}$ as well as current sources of $I_{nZi}$ at every $Z_i$ terminal. Noise of a passive resistor can be modeled as a voltage source whose spectral density function is $V_{nR}^2=4kTR$ where k is Boltzmann's constant, T is absolute temperature, and R is the resistance size. FIG. 9A shows circuit 90a which is the filter of FIG. 5 including various noise sources. FIG. 9B shows circuit 90b which is the filter of FIG. 7 including various noise sources.

It can be observed that the TFs due to the resistors noise sources of the I-path ($V_{nRIa}$, $V_{nRIb}$, $V_{nRQa}$, and $V_{nRQb}$) are same for both filters. Hence their noise contributions will be equivalent. Also, it can be shown that TFs due to $V_{nYIa}$, $V_{nYIb}$, $V_{nYQa}$ and $V_{nYQb}$ in FIG. 9A and their counterparts $V_{nXIa}$, $V_{nXIb}$, $V_{nXQa}$ and $V_{nXQb}$ in FIG. 9B are identical. In addition, it can be seen that the current noise sources of ($I_{nXIa}$, $I_{nzIa1}$, $I_{nzIa2}$, $I_{nzIa3}$, $I_{nXIb}$, $I_{nZIb1}$, $I_{nZIb2}$, $I_{nZIb3}$) and their Q path associates in both filters exhibit same TFs and hence they will have same noise contribution. Moreover, it can be shown that the respective noise sources $I_{nYIa}$, $I_{nYIb}$, $I_{nYQa}$, $I_{nYQb}$ and $I_{nzIa4}$, $I_{nzIb4}$, $I_{nzQa4}$, $I_{nzQb4}$ have similar contributions. Therefore, the two filters will have same noise performance for a common realization of CCII and CA.

In fact, the VBs incorporated in the CCII not only limit the input/output signal swing but also the circuit bandwidth. An op-amp based VB, for example, limits the bandwidth of the CCII to the unity-gain frequency of the op-amp (BW=$g_{m1}/C_C$) where $g_{m1}$ is transconductance of the input stage and $C_C$ is the compensation capacitor. The location of the introduced dominant pole depends on the minimum value of stable closed-loop gain or equivalently the maximum value of the feedback factor. Thus, the largest $C_C$ is required for the case demanding stable closed loop gain as low as unity. In order to compensate for the large $C_C$, gm1 must be increased often through increasing the power consumption.

Figure 10:
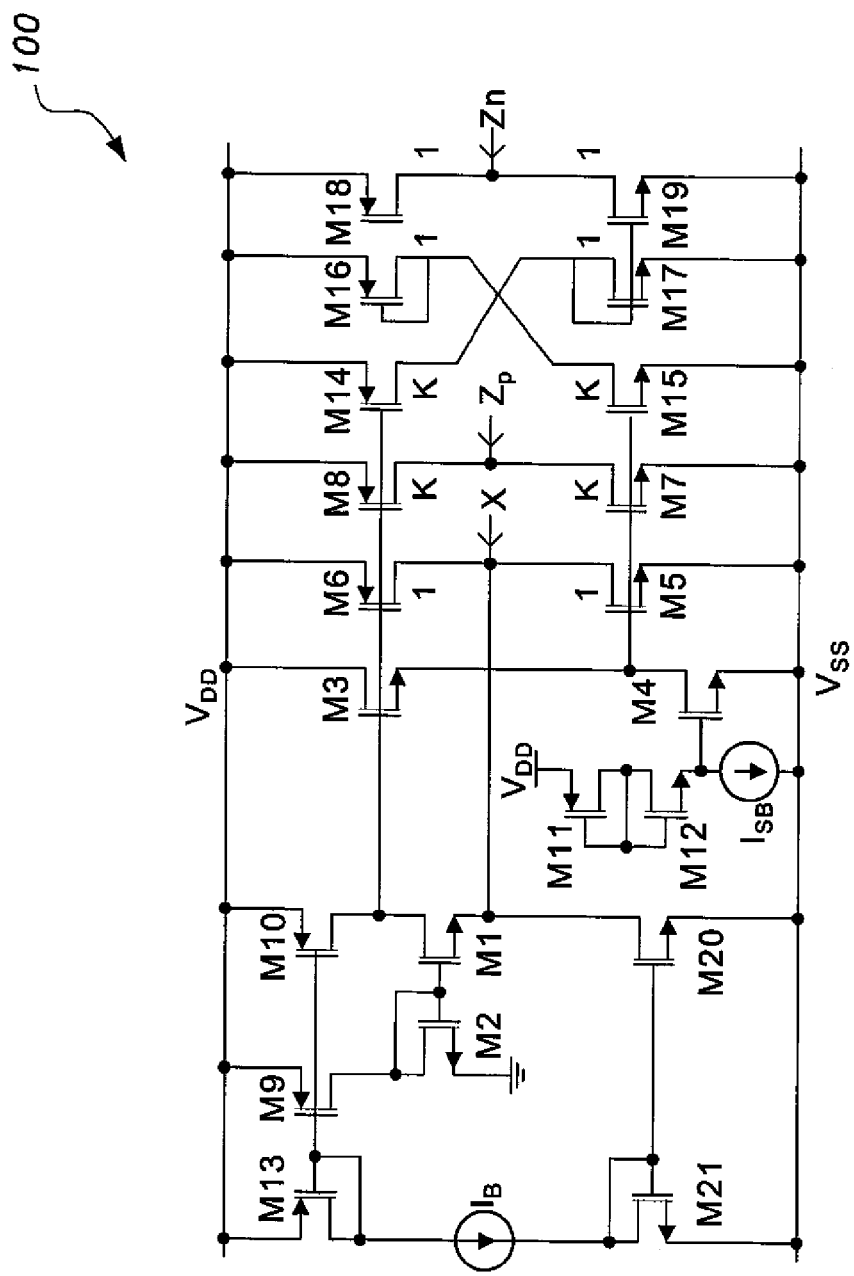
FIG. 10 is a circuit diagram of a low power CMOS CA according to the present invention.

On the other hand, a simpler input stage is required in the CA design leading to improved frequency response and/or reduced power consumption. A class-AB low-power CA circuit 100 is shown in FIG. 10. Transistors M1-M2 biased with constant current provide the required virtual ground and the negative feedback formed by the class-AB output stage transistors M3-M6 reduces the input resistance and improves the linearity of the input stage. The high frequency operation of the CA is limited by the dominant pole due to the high impedance node at the drain of transistors M10 and M1. The pole will be at $1C_T(rds1 \| rds10)$ where $C_T$ is due to capacitances of transistors M1, M10, M3, M6, M8 and M14.

It has been shown that the CCII and CA based filters exhibit similar noise performance. However, the CA based filter exhibits better signal swings, provides higher common-mode rejection, and can support higher bandwidths. Therefore, it is expected that the CA-based filter would provide better dynamic range while consuming lower power and hence it may be more desirable or advantageous.

Noise can be, in some cases, the main limitation of a CM approach. This section describes the noise performance of the complex filter of FIG. 9B in detail. First, the noise terminal characteristics of the CA of FIG. 10 are determined. The noise contribution of the class-AB output stage to $V_{nX}$ can be neglected since it is divided by the gain of the first stage.

$$V_{nX}^2 = V_{nM1}^2 + V_{nM2}^2 + \left(\frac{g_{m4}}{g_{m1}}\right)^2(V_{nM4}^2 + V_{nM5}^2) \tag{24}$$

where $V_{nMi}$ are the equivalent input noise source of MOSFETs given by $v_{nMi}^2=8kT/(3g_{mi})$ and where gm is the transconductance of the transistor. The matched transistors M1-M2 and M4-M5 have same noise. This noise source can be reduced by selecting a large $g_{m1}$ whereas the noise spectral density functions of $I_{nX}$ and $I_{nZ}$ can be expressed as:

$$I_{nX}^2=(g_{m10})^2 V_{nM10}^2+(g_{m11})^2 V_{nM11}^2 \tag{25}$$

$$I_{nZ}^2=(g_{m12})^2 V_{nM12}^2+(g_{m13})^2 V_{nM13}^2. \tag{26}$$

A $4^{th}$-order complex filter for implementing the channel-select filter in a low-IF BT receiver was realized by cascading two sections of the filter of FIG. 8B. The total output noise of the complete filter can be calculated as follows. The total output current noise spectral density of the second polyphase stage ($I_{no\_poly2}^2$) due to the 24 noise sources is determined. For example, the noise contributions due to four noise sources are given by (27) shown below through (30).

$$\frac{I_{ol}}{I_{nXIa}} = \frac{s^3C^3R^3 + s^2(C^2R^2 + C^2R^2K_q) + s(CR+CRK_q+CRK_c^2)+(1+K_c^2)}{D(s)} \text{ and} \tag{27}$$

$$\frac{I_{ol}}{I_{nXQa}} = \frac{s^2 2C^2R^2K_c + s(CRK_qK_c+2CRK_c)+K_qK_c}{D(s)} \text{ and} \tag{28}$$

$$\frac{I_{ol}}{V_{nRIa}} = \frac{s^3C^3R^2+s^2C^2RK_q+s(C-CK_c^2)}{D(s)} \tag{29}$$

$$\frac{I_{ol}}{V_{nRQa}} = \frac{s^2 2C^2RK_c+sCK_qK_c}{D(s)}. \tag{30}$$

where D(s) is given by (31) below. The output spectral density of the first polyphase stage ($I_{no\_poly\_1}^2$) is identical to $I_{no\_poly\_2}^2$ but by substituting the proper value of $K_q$.

$$D(s)=s^4C^4R^4+s^3(2C^3R^3K_q)+s^2(2C^2R^2+C^2R^2K_q^2+2C^2R^2K_c^2)+s(2CRK_qK_c^2+2CRK_q)+(K_q^2K_c^2+K_c^4-2K_c^2+1) \tag{31}$$

In order to determine the noise contribution of the first stage to the output noise of the I path, the transfer function $H_{IQ}(s)=I_{ol}/(I_I+I_Q)$ is calculated for real input $I_I$ and $I_Q$ ($I_I=I_Q$ is assumed at the end of the analysis since the noise of the I and Q paths are equal) leading to $H_{IQ}$ of the transfer function $H_{IQ}(s)$:

$$H_{IQ} = \frac{s^2C^2R^2+s(2CRK_2+CRK_1)+(1+K_1K_2-K_2^2)}{D_{IQ}(s)} \tag{32}$$

where $D_{IQ}(s)$ is given by (33) shown below and $H_{IQ}(s)$ is the transfer function of the electronic filter circuit, $D_{IQ}(s)$ is the denominator portion of the transfer function, C is the capacitive portion of said RC circuits, R is the resistive portion of said RC circuits, $K_1$ and $K_2$ are gains of the electronic filter circuit, and s is a Laplace transform parameter representing the complex frequency jω.

$$D_{IQ}(s) = s^4 C^4 R^4 + s^3 2 C^3 R^3 K_1 + s^2 (2 C^2 R^2 K_2^2 + C^2 R^2 K_1^2 + 2 C^2 R^2) + s(2 C R K_1 K_2^2 + 2 C R K_1) + (1 + K_1^2 K_2^2 - 2 K_2^2 + K_2^4)$$ (33)

Therefore, the total output noise spectral density is calculated by $$I_{no\_poly}^2 = I_{no\_poly2}^2 + I_{no\_poly1}^2 |H_{IQ}(s)|^2.$$ (34)

A fully differential 4$^{th}$-order complex filter for implementing the channel-select filter for a low-IF BT receiver was realized by cascading two sections of the filter of FIG. 7. It has been designed with R=40 kΩ and C=8 pF and $K_c$=6 in order to achieve bandwidth of 1 MHz and center frequency of 3 MHz. Butterworth response is obtained with $K_q$=1.80 (first stage) and 0.77 (second stage) while unity differential gain is achieved with Kg=0.5. On chip CAs and passive resistors of 1 kΩ were used for V-to-I conversion of the input signals whereas output current signals are changed to voltages via passive resistors of 1 kΩ. The required quadratic signals are produced by employing the Pulsar Microwave Corporation hybrid 90° QE-19-442 component and the resultant output differential voltages are measured by utilizing the Agilent 1141A differential probe. The filter was fabricated in a 0.18 μm standard CMOS process. Since power consumption is the main design specification in portable devices, capacitor-banks are preferred over programmable CCII and CAs.

Figure 11:
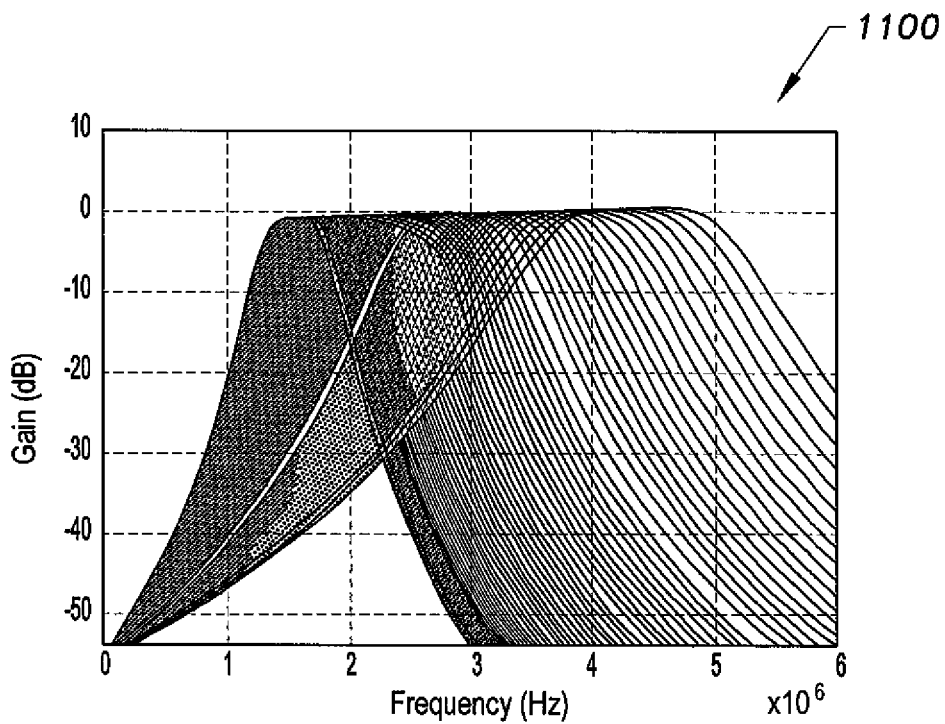
FIG. 11 is a magnitude response center frequency tuning plot of the CA filter according to the present invention.
Figure 12:
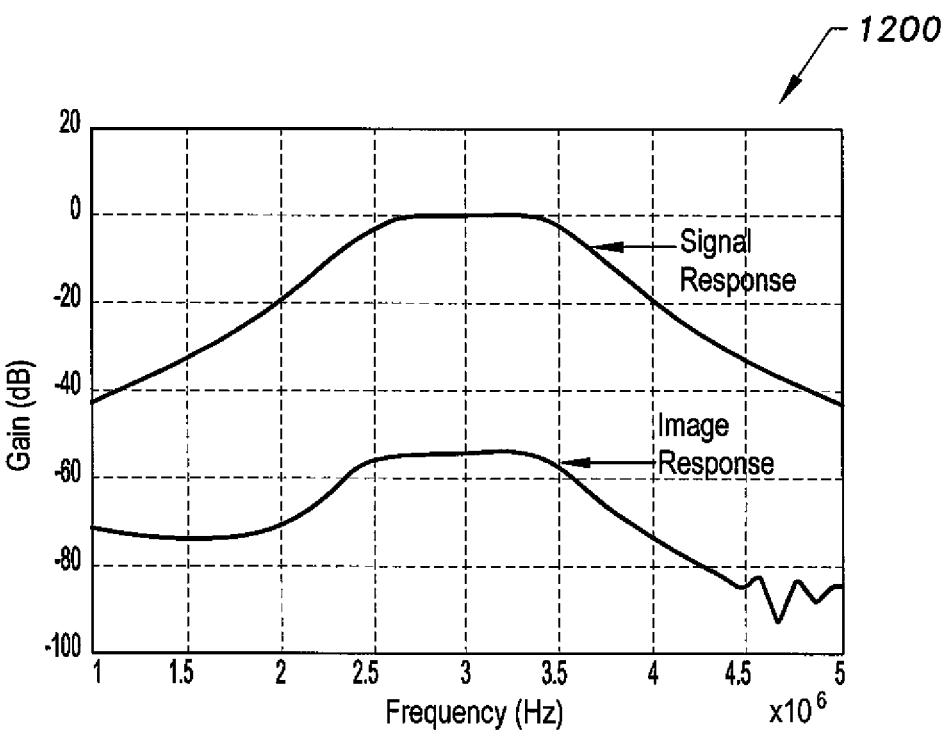
FIG. 12 is a nominal setting plot of signal and image responses of the CA filter according to the present invention.
Figure 13:
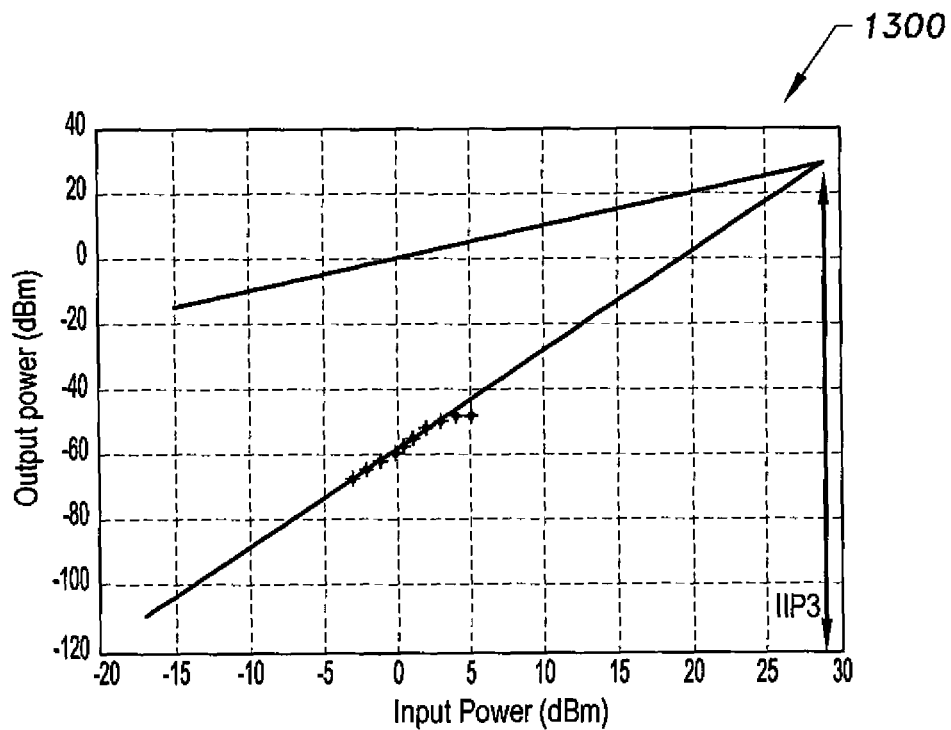
FIG. 13 is an input third order-intercept point inband (IIP3) estimation plot of the CA filter according to the present invention.
Figure 14:
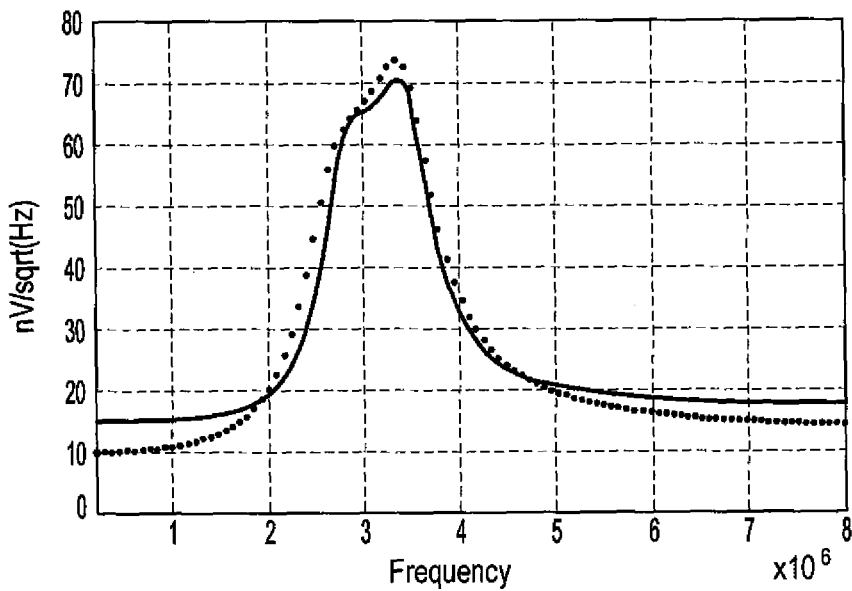
FIG. 14 is a plot showing output noise measurements vs. calculations of the CA filter according to the present invention.

Selecting $I_B$=5 μA and $I_{SB}$=2 μA leads to a total biasing current of 0.58 mA for the whole filter. Two fully differential CAs and four resistors are used to generate the required input currents from voltage generators. Also, the various current outputs are changed to voltages which are measured with the use of voltage buffers. The signal magnitude response is shown in plot 1100 of FIG. 11. The frequency responses show center frequency tuning from 1.5 MHz to 4.5 MHz by adjusting 6-bit capacitor arrays. An IRR of better than 56 dB is accomplished as shown in plot 1200 of FIG. 12. Blocker attenuations at +2 MHz and +3 MHz are found to be 43 dB and 57 dB at the nominal center frequency setting. The input third order-intercept point (IIP3) results for in-band (plot 1300 of FIG. 13), out-of-band near, and distant blockers are obtained using two testing tones at 2.9 MHz and 3.1 MHz, 4 MHz and 5 MHz, and 6 MHz and 9 MHz, respectively. The noise root spectral density plot 1400 of the filter is shown in FIG. 14. The measured group delay has maximum variation of less than 0.4 μs well below BT specifications of 1 μs. The power supply rejection (PSR) was found to be approximately 48 dB, which is often lower than its counterparts obtained from op-amp based filters. A summary of the experimental results is given in Tables 2A and 2B, where noise measurements are referred to 50Ω. It can be seen that the complex filter is power efficient and exhibits improved characteristics in terms of SFDR, and IRR. Also, it's SFDR for far blockers and IRR are respectively relatively high.

TABLE 2A

Experimental results for complex filter

| Technology (Technique) | Approach & Total Devices | Order | $f_c$ (MHz) & Bandwidth (MHz) | Noise ($V_{rms}$) | IRR (dB) | IIP3 (dBm) In-band, Near, & Far |
|---|---|---|---|---|---|---|
| 0.18 μm CMOS (CA-RC) | Biquad & 8 | 4 | 3 & 1 | 73μ | >56 | 29, 41, & 47 |

TABLE 2B

Experimental results for complex filter

| Technology (Technique) | SFDR (dB) In-band Near, & Far | Area (mm$^2$) | Supply (V) | Power (mW) | FOM (pJ) |
|---|---|---|---|---|---|
| 0.18 μm CMOS (CA-RC) | 65.8, 73.8, & 77.8 | 0.4 | 1.8 | 1 | 0.04 (0.01 for Far SFDR) |

This work systematically shows that the relatively more power efficient complex filters are those obtained from CM structures based on the TCAs and CAs. While embodiments of complex filters can be realized with same CMOS topologies (for example same CCII), it is analytically shown that CA-based filter provides a relatively better dynamic range than its TCA or (CCII) counterpart. The merits and demerits of various possible complex filter realizations are demonstrated, together with results about signal limitations, noise, and common-mode rejection are reported. Embodiments of a 4th-order complex filter, such as based on the filter section of FIG. 7, can be designed to implement the channel-select filter for low-IF BT receiver, for example. The fabricated complex filter has demonstrated inherent potential to operate with relatively lower power consumption than active-RC filters and provide relatively better linearity than gm-C techniques. Consequently, embodiments of an optimal low power complex filter can be utilized in relation to a channel select filter for digital video broadcasting-handheld (DVB-H) receiver, for example.

It is to be understood that the present invention is not limited to the embodiments described above, but encompasses any and all embodiments within the scope of the following claims.

I claim:

1. An optimal low power complex filter, comprising:
    a plurality of current amplifiers (CAs) configured as a cascade of current mode (CM) complex integrators to provide a fully differential biquad electronic filter circuit, the electronic filter circuit including input terminals to receive in-phase (I) and quadrature (Q) input signals for filter processing of the input signals, and including output terminals to provide filtered I and Q output signals; and
    a plurality of series RC circuits, each RC circuit having a resistor's lead connected to a respective CA's input and a capacitive lead connected to ground.

2. The optimal low power complex filter according to claim 1, wherein said plurality of CAs in said electronic filter circuit are configured to comprise a complex bandpass filter.

3. The optimal low power complex filter according to claim 2, wherein said bandpass filter generates a transfer function in the filter processing wherein a relation of in-phase and quadrature output signals to said input signals is characterized by:

$$H_p(s) = \frac{K_g/(C^2R^2)}{(s-j\omega_c)^2 + (s-j\omega_c)K_q/(CR) + 1/(C^2R^2)},$$

wherein Hp(s) is the transfer function of said electronic filter circuit, C is the capacitive portion of said RC circuits, R is the resistive portion of said RC circuits, $K_g$ and $K_q$ are gains of the respective current amplifiers, and s is a Laplace transform parameter representing the complex frequency jω.

4. The optimal low power complex filter according to claim 3, wherein said bandpass filter is fabricated using an 0.18 μm CMOS technology.

5. The optimal low power complex filter according to claim 3, further comprising:
an input virtual ground to sense a current in said resistor associated with a corresponding CA, with each CA including a plurality of outputs to provide gains to convert said integrators from a lossy integrator to a lossless integrator, to provide complex loops and cascading in the electronic filter circuit, respectively, in the filter processing of the input signals.

6. The optimal low power complex filter according to claim 3, wherein said CAs have both positive (Zp) and negative (Zn) outputs to perform subtraction at said output terminals.

7. The optimal low power complex filter according to claim 3, wherein said cascade of CM complex integrators is comprised of two sections providing a 4th-order complex filter.

8. The optimal low power complex filter according to claim 2, wherein said bandpass filter is fabricated using an 0.18 μm CMOS technology.

9. The optimal low power complex filter according to claim 2, wherein said cascade of CM complex integrators is comprised of two sections providing a 4th-order complex filter.

10. The optimal low power complex filter according to claim 1, wherein said cascade of CM complex integrators is comprised of two sections providing a 4th-order complex filter.

11. An optimal low power complex filter, comprising:
a plurality of type 2 current conveyers (CCII), each CCII being configured as a transconductance amplifier (TCA) having a Y input, an X input, and a plurality of current outputs, the TCAs being configured in multiple stages, a first stage of said TCAs to receive in-phase (I) and quadrature (Q) input signals for filter processing, each subsequent stage of said TCAs being connected in a feedback arrangement with a corresponding previous stage, and a last stage to provide in-phase (I) and quadrature (Q) filtered output signals; and for each stage, a capacitor C connected between said Y input and ground, and a resistor R connected between said X input and ground.

12. The optimal low power complex filter according to claim 11, wherein said complex filter generates a transfer function in the filter processing wherein a relation of in-phase and quadrature output signals to input signals at said first stage Y inputs is characterized by the relation:

$$H_p(s) = \frac{K_g/(C^2R^2)}{(s-j\omega_c)^2 + (s-j\omega_c)K_q/(CR) + 1/(C^2R^2)}$$

wherein $H_p$(s) is the transfer function of said complex filter, $\omega_c$ is a center frequency, $K_g$ and $K_q$ are gains of said complex filter, C is a capacitance in said complex filter, R is a resistance in said complex filter, and s is a Laplace transform parameter representing complex frequency jω.

* * * * *